United States Patent [19]
Miyabayashi

[11] Patent Number: 6,028,796
[45] Date of Patent: *Feb. 22, 2000

[54] READ-OUT CIRCUIT FOR SEMICONDUCTOR MEMORY DEVICE

[75] Inventor: Masayuki Miyabayashi, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 00 days.

[21] Appl. No.: 07/862,066

[22] Filed: Apr. 2, 1992

[51] Int. Cl.[7] .................................................. G11C 7/00
[52] U.S. Cl. ................ 365/189.05; 365/189.11; 365/203
[58] Field of Search .............................. 365/189.05, 203, 365/189.06, 189.11

[56] References Cited

U.S. PATENT DOCUMENTS

| | | |
|---|---|---|
| 4,731,758 | 3/1988 | Lam et al. ............................. 365/203 |
| 4,995,003 | 2/1991 | Watanabe et al. .................. 365/189.05 |
| 5,153,459 | 10/1992 | Park et al. ............................ 365/203 |
| 5,161,120 | 11/1992 | Kajimoto et al. ................... 365/189.05 |

OTHER PUBLICATIONS

Paul M. Chirlian, Analysis and Design of Integrated Electronic Circuit, 1981, p. 351.

*Primary Examiner*—Son T. Dinh
*Attorney, Agent, or Firm*—Hill & Simpson

[57] ABSTRACT

Disclosed is a read-out circuit for use with semiconductor memory devices such as image memories comprising both a group of randomly accessible memory cells and serial registers that are serially accessed. The read-out circuit contains presetting means for presetting the output side of a column selector of the memory before signal read-out. This prevents the drop in performance margin attributable to boosted parasitic capacity on the column selector output side.

2 Claims, 4 Drawing Sheets

READ-OUT CIRCUIT FOR SEMICONDUCTOR MEMORY DEVICE

BACKGROUND OF THE INVENTION

1. Field of the Invention

The present invention relates to a read-out circuit for use with semiconductor memory devices and, more particularly, to a read-out circuit comprising first selecting means for selectively reading data from a plurality of memory means; first data storing means for storing the data read out by the selecting means; transferring means for transferring the data stored in the first data storing means in synchronism with an external clock signal; second data storing means for storing the data sent from the transferring means; and second selecting means for selectively outputting to an output port the data stored in the second data storing means.

2. Description of the Prior Art

Image memories generally contain both a group of matrix type memory cells (e.g., DRAM or SRAM memory array) that are randomly accessible, and serial registers that are serially accessible. The two sets of memory elements are interfaced through the so-called read-out circuit. The typical prior art read-out circuit is illustratively constructed as shown in FIG. 7.

In FIG. 7, reference characters SA represent a sense amplifier each. Each sense amplifier amplifies the data that is read from a memory cell to a bit line BL. The data coming from the memory cell and amplified by the sense amplifier SA is transferred through first selecting means (comprising column selectors Qc, Qc, . . . ) to first data storing means F.F.D. The data storing means F.F.D is illustratively a single-bit register made of a flip-flop device.

The data stored in the first data storing means F.F.D is transferred to second data storing means F.F.S in synchronism with an external clock signal. More specifically, the data is transferred via an MOS transistor Qt that is switched in accordance with a transfer signal T.

The second data storing means F.F.S is illustratively a single-bit register comprised of a flip-flop device. The data stored in the second data storing means F.F.S is read out onto a data bus via second selecting means (containing Y selectors Qy, Qy, . . . ) receiving a Y select signal Y.

In this setup, a single-bit register is provided for a plurality (n) of bit pairs constituting a single block BLK. There are m blocks for which are furnished m single-bit registers that make up an m-bit serial register. Illustratively, the number m is 4.

In the read-out circuit of FIG. 7 for use with a semiconductor memory device (image memory), the capacity on the output side of the column selectors Qc, Qc, . . . (output side of the first data storing means F.F.D) typically becomes too large to be driven adequately by the small sense amplifier SA. The reason for this is as follows: An n-bit (e.g., 128- or 256-bit) column decoder connected to a single line inevitably increases the parasitic capacity of that line. The line with such a boosted parasitic capacity, when driven by one tiny sense amplifier SA, prolongs the time it takes to switch the column selector output line level from 0 to 1 or 1 to 0. The direction of the level transition depends on whether the MOS transistor constituting each column selector gate is of n-channel type or p-channel type.

With more time required for line level changeover, the time it takes to read data is also prolonged. More specifically, since each column selector gate usually contains an n-channel MOS transistor Qc, the performance margin involved is worsened when a 1 (a high level) is to be transferred. That is, the transition from 1 to 0 is quick but the reverse takes time. If the column selector were composed of a CMOS arrangement, this problem would not be experienced. However, such a measure makes the layout of the device so difficult to achieve that efforts to attain high integration are seriously hampered.

SUMMARY OF THE INVENTION

It is therefore an object of the present invention to overcome the above-described drawbacks and disadvantages of the prior art and to provide a read-out circuit for use with semiconductor memory devices such as image memories, the read-out device preventing the decrease in performance margin resulting from the increased parasitic capacity on the output side of the selecting means such as a column decoder, whereby the time required to read out data is shortened.

In carrying out the invention and according to one aspect thereof, there is provided a read-out circuit comprising first selecting means for selectively reading data from a plurality of memory means; first data storing means for storing the data read out by the selecting means; transferring means for transferring the data stored in the first data storing means in synchronism with an external clock signal; second data storing means for storing the data sent from the transferring means; and second selecting means for selectively outputting to an output port the data stored in the second data storing means. What characterizes the inventive read-out circuit is that it is further equipped with presetting means for presetting the output side of the selecting means such as the column decoder.

Further objects, features and advantages of the invention will become more apparent upon a reading of the following description and appended drawings.

DESCRIPTION OF THE PREFERRED EMBODIMENTS

The preferred embodiments of the invention will now be described with reference to the accompanying drawings.

Figure 1:
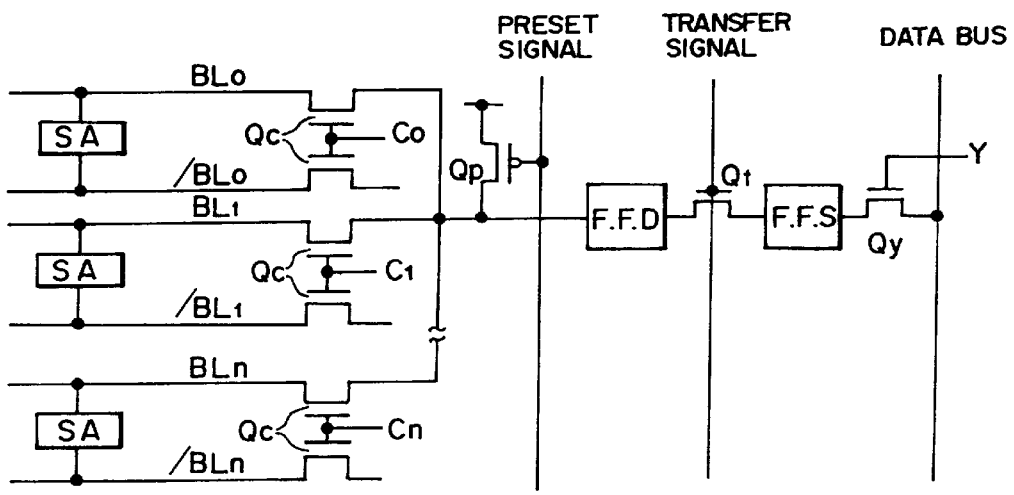
FIG. 1 is a circuit diagram of a read-out circuit for use with a semiconductor memory device, the circuit being a first embodiment of the invention.
Figure 2:
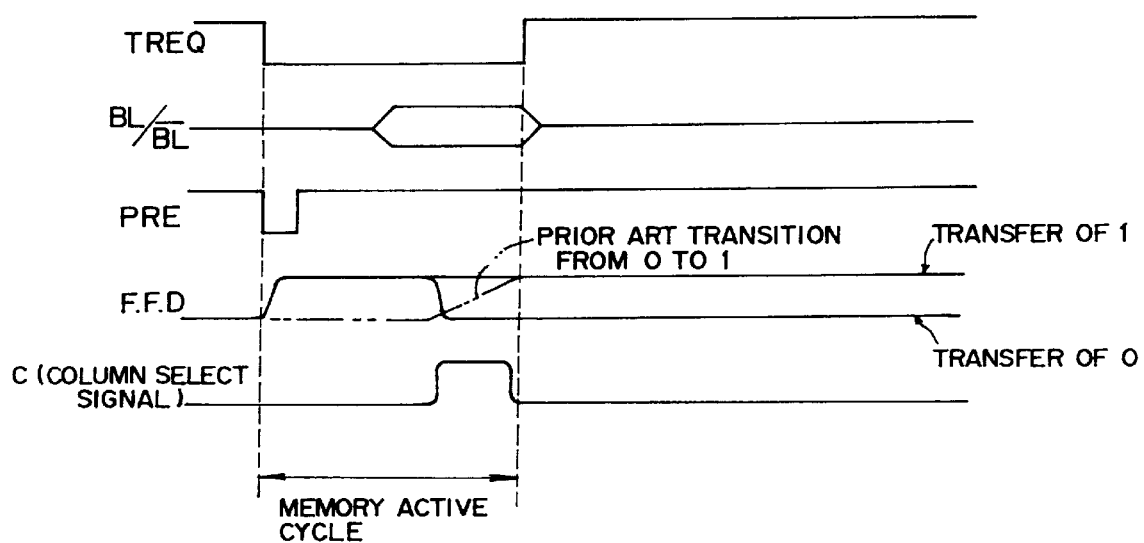
FIG. 2 is a timing chart showing how the first embodiment principally operates.

FIG. 1 is a circuit diagram of a read-out circuit for use with a semiconductor memory device according to the invention. This circuit is constructed as the first embodiment of the invention. FIG. 2 is a timing chart that shows how the first embodiment principally operates. In FIG. 1, reference characters SA represent a sense amplifier each; Qc, Qc, . . . are MOS transistors constituting a column selector as first selecting means; F.F.D is first data storing means such as a flip-flop device comprising a single-bit register for storing the data from the column selector; Qt is an MOS transistor for transferring data stored in the first data storing means F.F.D; F.F.S is second data storing means for storing the data transferred via the MOS transistor Qt from the first data storing means F.F.D; and Qy is an MOS transistor constituting a Y selector (low decoder). Under control of a Y select signal Y, the Y selector Qy transmits the data stored in the second data storing means F.F.S.

Figure 7:
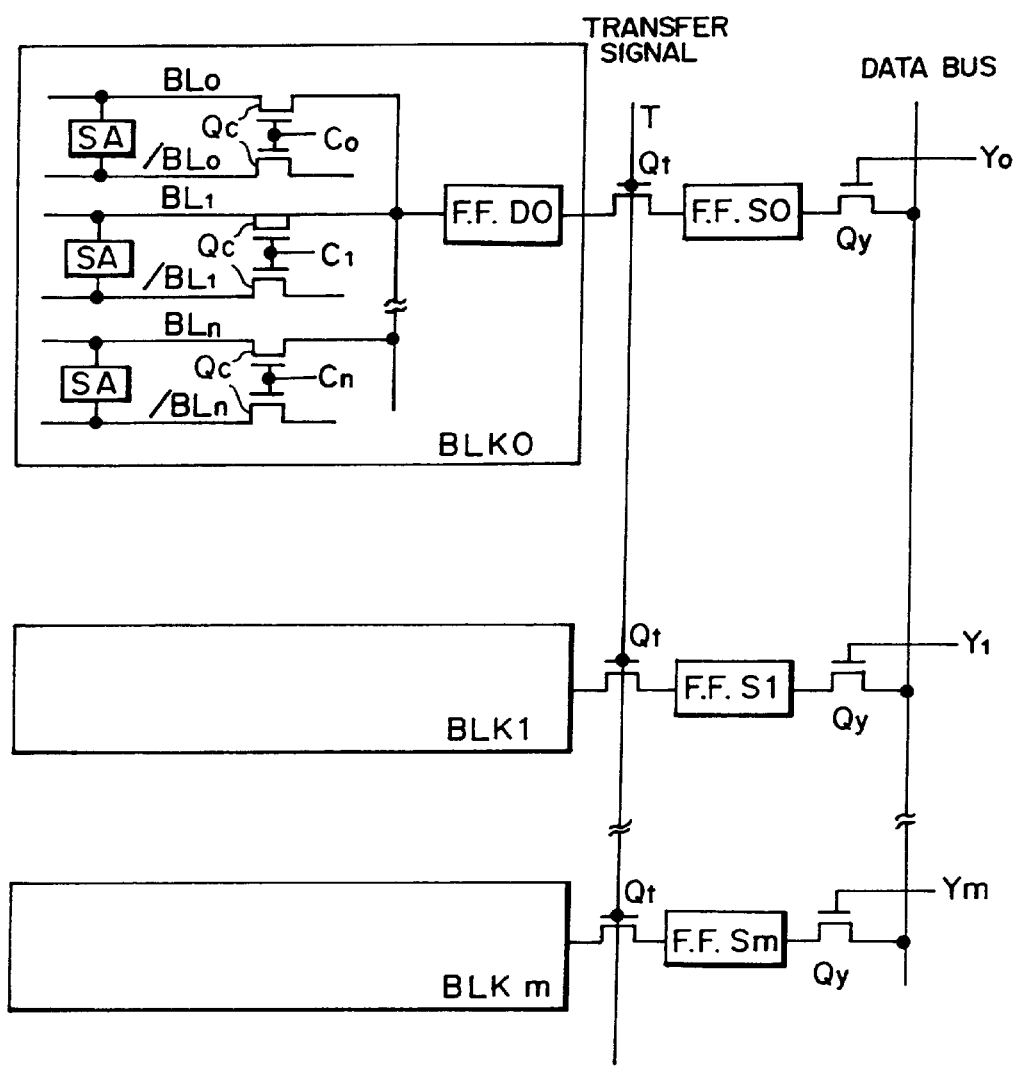
FIG. 7 is a circuit diagram of typical prior art read-out circuit for use with a semiconductor memory device.

Qp is a p-channel type preset MOS transistor activated upon receipt of a preset signal to preset (i.e. pre-charge) the output line of the column selector to the high level. What makes the first embodiment different from the prior art setup of FIG. 7 is that the former comprises the preset MOS transistor Qp.

How the first embodiment primarily operates will now be described by referring to the timing chart of FIG. 2, When a transfer request signal TREQ goes from High to Low, a preset signal PRE arrives in synchronism therewith. The preset signal PRE turns on the preset MOS transistor Qp. This charges to the high level the output line of the column selector, i.e., the input side of the first data storing means F.F.D. After the charging, the preset signal PRE disappears, turning off the preset MOS transistor Qp. Thereafter, a word signal causes the data in the memory cells it designates to be read onto 126 or 256 bit lines BL simultaneously. The data are amplified by the sense amplifiers SA. With the data read out onto the bit lines, entry of a column select signal C causes one of the selected data items to be transferred from the bit line to the input terminal of the first data storing means F.F.D. The transferred data item is latched by the first data storing means F.F.D.

The data item is then transferred via the MOS transistor Qt to the second data storing means F.F.S, and is latched thereby. The data item is placed onto the data bus via the Y selector Qy.

The first embodiment of the invention presets the output line of the column selector, i.e., the input terminal of the first data storing means F.F.D, before the start of data transfer. This eliminates the possibility of exhausting the performance margin upon transfer of a 1.

For transfer of a 1, the high-level signal is transferred as pre-charged; for transfer of a 0, the level signal is pulled down to 0 by the sense amplifier SA. Because the column gate is an n-channel MOS transistor, the pull-down speed is high. This makes high-speed data transfer possible.

A two-dot chain line in FIG. 2 indicates the change of the level on the input side of the first data storing means F.F.D when a 1 is transferred by the typical prior art read-out circuit. The prior art transition of the level is depicted here for comparison with what the first embodiment of the invention has to offer. It can be seen that the first embodiment provides more performance margin than the prior art setup.

Figure 3:
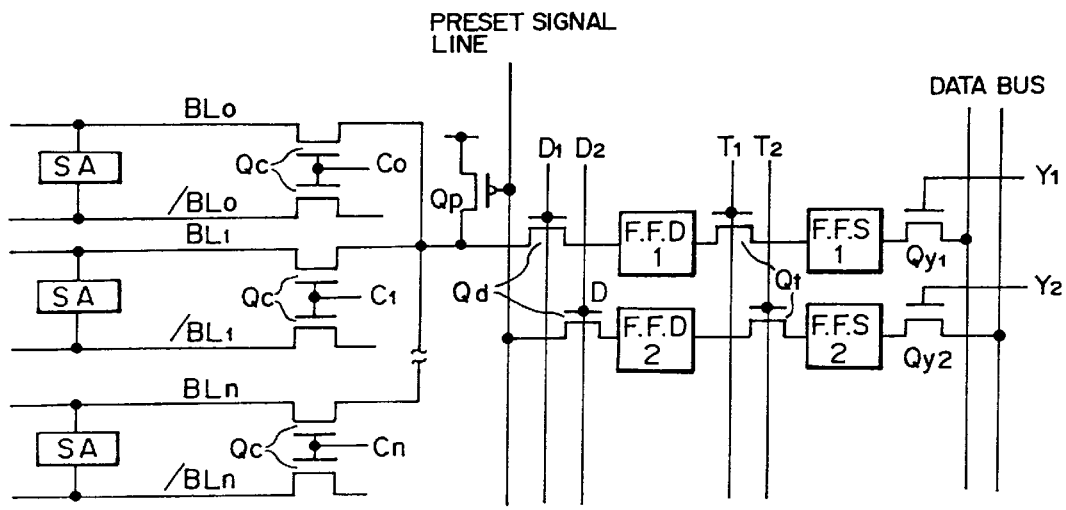
FIG. 3 is a circuit diagram of another read-out circuit for use with a semiconductor memory device, the circuit being a second embodiment of the invention.
Figure 4:
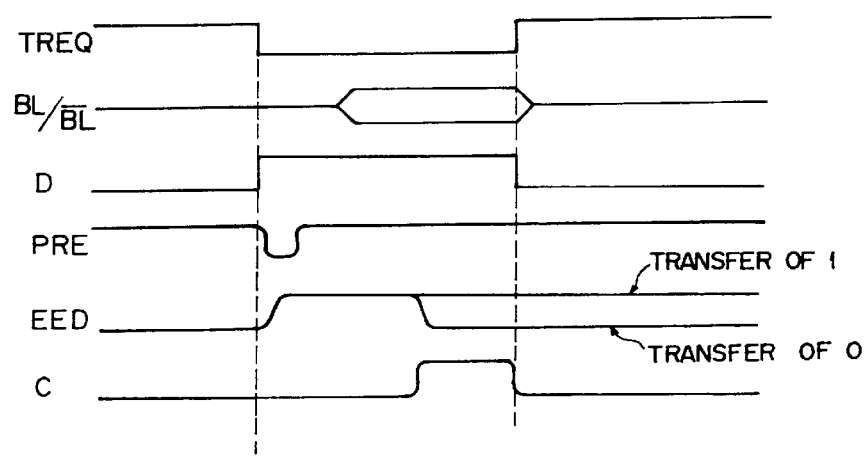
FIG. 4 is a timing chart depicting how the second embodiment principally operates.

FIG. 3 is a circuit diagram of another read-out circuit for use with a semiconductor memory device according to the invention. This circuit is constructed as the second embodiment of the invention. FIG. 4 is a timing chart that depicts how the second embodiment operates. The second embodiment involves applying the invention to a semiconductor memory device read-out circuit having two read-out ports. With the second embodiment, there are two first data storing means F.F.D and two second data storing means F.F.S per serial register bit. There are also provided two MOS transistors Qt (constituting the transferring means) and two MOS transistors Qy (making up the Y selector) for every serial register bit.

The output signal of the column selector is divided for distribution to the two first data storing means F.F.D 1 and F.F.D 2. The division of the signal is accomplished by MOS transistors Qd and Qd for data distributing purposes. The two MOS transistors are interposed between the two data storing means F.F.D 1 and F.F.D 2, and are controlled by distribution signals D1 and D2.

The second embodiment is the same as the first embodiment of FIG. 1 in this respect: that both embodiments have the preset MOS transistor Qp for pre-charging the output line of the column selector upon receipt of a preset signal before data transfer.

The operational aspects of the first and the second embodiments are essentially the same. As shown in FIG. 4, what makes the second embodiment differ from the first is merely this: that the distribution signal D of the second embodiment goes High when a transfer request signal TREQ remains Low (i.e., during memory active cycle), thereby turning on the data-distributing MOS transistor Qd.

Figure 5:
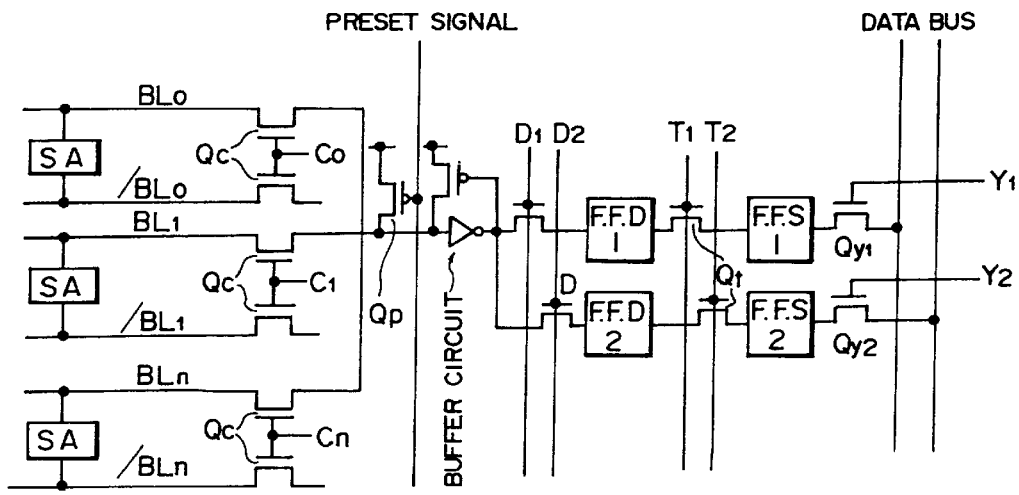
FIG. 5 is a circuit diagram of a further read-out circuit for use with a semiconductor memory device, the circuit being a third embodiment of the invention.
Figure 6:
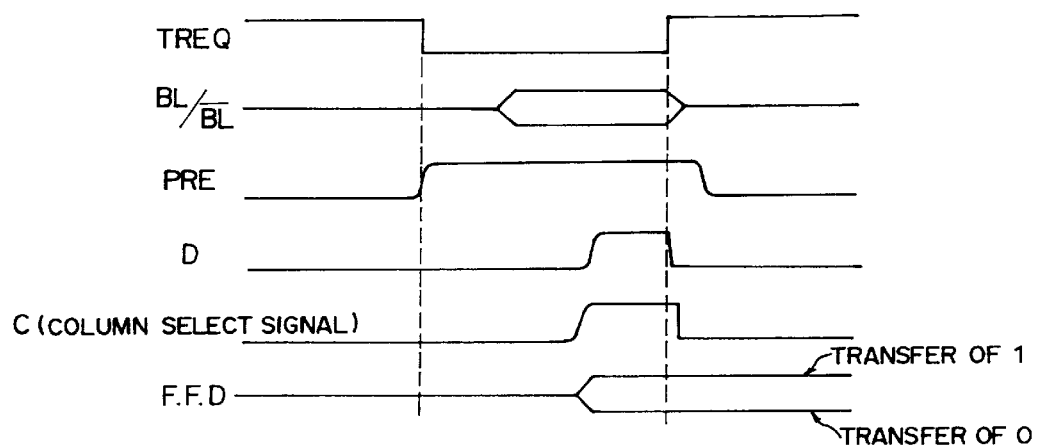
FIG. 6 is a timing chart indicating how the third embodiment principally operates.

FIG. 5 is a circuit diagram of a further read-out circuit for use with a semiconductor memory device according to the invention. This circuit is constructed as the third embodiment of the invention. FIG. 6 is a timing chart that indicates how the third embodiment operates. The third embodiment is a variation of the second embodiment in which a buffer circuit is interposed between the column selector on the one hand, and the first data storing means F.F.D 1 and F.F.D 2 on the other, to provide substantial separation therebetween. The separation alleviates the load imposed on the output side of the column selector. The reduced load burden in turn enhances the speed of data transfer. Other aspects of the third embodiment are essentially the same as those of the other embodiments.

The data storing means F.F. is illustratively composed of a flip-flop circuit that combines two inverters. In this setup, better results are obtained when the inverter for signal transmission is made of a large MOS transistor arrangement, and when the inverter for positive feedback is constituted by an MOS transistor arrangement smaller in capacity than the other MOS transistor but having a greater gate length. In addition to the two inverters, the data storing means F.F.D and F.F.S may each contain, on the output side of the signal-transmitting inverter, an MOS transistor for phase matching purposes.

If the column selector gate is made of a pch-MOS transistor, it takes more time to transfer a 0 than a 1. In that case, the low level signal for 0 is transferred as pre-discharged, not pre-charged. Thus the invention applies whether each of the gates constituting the first selecting means is an n-channel MOS transistor or a p-channel MOS transistor.

As described, the read-out circuit for semiconductor memory devices according to the invention comprises first selecting means for selectively reading data from a plurality of memory means; first data storing means for storing the data read out by the selecting means; transferring means for transferring the data stored in the first data storing means in synchronism with an external clock signal; second data storing means for storing the data sent from the transferring means; second selecting means for selectively outputting to an output port the data stored in the second data storing means; and presetting means for presetting the line onto which the first selecting means reads data.

The presetting means allows the read-out circuit to preset (i.e., pre-charge or pre-discharge) the output side of the first data storing means before signal read-out. This prevents the decrease in performance margin resulting from increased parasite capacity, whereby the operation time is shortened significantly.

As many apparently different embodiments of this invention may be made without departing from the spirit and scope thereof, it is to be understood that the invention is not limited to the specific embodiments thereof except as defined in the appended claims.

What is claimed is:

1. A read-out circuit for use with a semiconductor memory device, said read-out circuit comprising:

first selecting means for selectively reading at least one datum from a plurality of memory means;

first data storing means for storing the data read out by said selecting means;

transferring means for transferring the data stored in said first data storing means in synchronism with an external clock signal;

second data storing means for storing the data transferred from said transferring means;

second selecting means for selectively outputting to an output port the data stored in said second data storing means; and presetting means for presetting the voltage level of the line onto which said first selecting means reads out data wherein said presetting means sets the voltage level at least substantially to a voltage of a full nominal high logic state.

2. A method for reading data from a semiconductor memory device comprising:

selectively reading at least one datum from a memory;

storing the data read out by said selecting means;

selectively outputting the data to an output port; and presetting the voltage level of a line onto which the data is placed at least substantially to a voltage of a full nominal high logic state.

* * * * *